United States Patent [19]
Vosburgh

[11] Patent Number: 5,602,749
[45] Date of Patent: Feb. 11, 1997

[54] METHOD OF DATA COMPRESSION AND APPARATUS FOR ITS USE IN MONITORING MACHINERY

[75] Inventor: Frederick Vosburgh, Vienna, Va.

[73] Assignee: MTC, Fairfax, Va.

[21] Appl. No.: 372,046

[22] Filed: Jan. 12, 1995

[51] Int. Cl.$^6$ ................................................. G06F 15/20
[52] U.S. Cl. .......................... 364/474.16; 364/474.17; 364/551.01; 340/679; 395/615; 341/123
[58] Field of Search ............... 364/424.01, 424.06, 364/474.16, 474.17, 506, 508, 550, 551.01; 73/570, 577, 658, 660; 340/679, 683; 395/600; 341/123

[56] References Cited

U.S. PATENT DOCUMENTS

| | | |
|---|---|---|
| 4,559,828 | 12/1985 | Liszka . |
| 4,660,145 | 4/1987 | Hansen ........................ 364/424.01 |
| 4,720,806 | 1/1988 | Schippers et al. ................. 364/551 |
| 4,885,707 | 12/1989 | Nichol et al. . |
| 4,931,949 | 6/1990 | Hernandez et al. . |
| 5,243,343 | 9/1993 | Moriyasu . |
| 5,249,053 | 9/1993 | Jain . |
| 5,270,951 | 12/1993 | Deters et al. ..................... 364/551.01 |
| 5,305,295 | 4/1994 | Chu . |
| 5,355,891 | 10/1994 | Wateridge et al. ..................... 128/702 |

*Primary Examiner*—Emanuel T. Voeltz
*Assistant Examiner*—Craig Steven Miller
*Attorney, Agent, or Firm*—Mathews, Woodbridge & Collins

[57] ABSTRACT

The present invention relates to a method and apparatus for monitoring machinery in which data is collected and stored based on application specific retention rules. Based on an alarm value, data records are adjusted by reducing the spectral resolution, coefficient precision and time intervals between records. An alarm is activated when the data value is greater than a predetermined alarm threshold value. Memory management can compare the memory availability to projected requirements. If the projected memory requirements exceeds memory availability, the data records can be interactively decimated. When decimation cannot make available sufficient memory for projected requirements within the retention rules, an alarm is issued. Collected data can be transferred with a removable nonvolatile memory or infrared communications with a computer device.

24 Claims, 8 Drawing Sheets

Display Options

1. Sensor Status
2. Alarm Status
3. Alarm Trend
4. Alarm Spectrum
5. Memory Status
6. Main Menu

FIG. 6

METHOD OF DATA COMPRESSION AND APPARATUS FOR ITS USE IN MONITORING MACHINERY

FIELD OF THE INVENTION

This invention relates to a method for monitoring machinery in which data compression is constrained by conflicting demands to minimize the cost of memory while providing sufficient memory to satisfy memory recording requirements to comply with Federal regulations and for alarm related analysis.

BACKGROUND OF THE INVENTION

Increasingly stringent Federal regulations directed to protecting workers and the environment require industry businesses to employ "best" maintenance practices. An example of such a Federal Regulation is the OSHA rule on Process Safety Management of Highly Hazardous Chemicals (29 CFR Ch. XVII 1910.119). Best maintenance practice increasingly include predictive maintenance to monitor vibration and other physical variables for forecasting machine failures. Gathering and maintaining complete records to comply with such regulations is not provided for in an efficient and economic fashion by conventional monitoring technology.

One conventional predictive maintenance system is described in U.S. Pat. No. 4,885,707 in which a portable data logger is used to measure vibration of machinery. The vibration is sensed by electromechanical transducers temporarily attached by an operator to permanent indexing mounts at each test station. Devices of this type do not automatically collect data on a specified schedule, are generally cumbersome to operate, have limited technical capabilities and are expensive to manufacture. The shortcomings of such devices result in limiting the frequency of data monitoring.

The use of portable data loggers is typically insufficient in satisfying government regulations. For example, human error of an analyst using the data logger such as being absent or forgetting can result in gaps in the data record. One conventional solution has been to employ centralized on-line systems connected to host computers to provide continuous records of the monitored apparatus. Conventional on-line systems have the drawback of having high data storage requirements resulting in high purchase costs.

U.S. Pat. No. 4,931,949 to the assignee of the present disclosure describes a gear defect analyzing system. Signals from a gear box are detected by an accelerometer and a shift encoder and fed to an analog pre-processing circuit. The pre-processor conditions the signal so it can be analyzed by a microcomputer. The system is capable of detecting, classifying and analyzing hard-to-find defects.

U.S. Pat. No. 5,305,295 relates to efficient data storage by matching compressed data records to sectors or blocks of appropriate known sizes. While this system achieves efficient utilization of space in memory, it assumes that all data are of equal value. In machine sensing differences in value can exist among individual records, making adaptive data compression desirable.

U.S. Pat. No. 5,249,053 describes variable data compression to achieve maximum image quality for filmless pictures stored in fixed size memory blocks. This device has the limitation that balancing maximum image quality with memory restrictions for a single data record at the time of data acquisition does not take into account the relative values or importance of a series of records or the data therein. The determination of the relative values of a series of data records is advantageous for providing regulatory compliant machine monitoring and providing optimum alarm condition analysis while minimizing system memory requirements.

U.S. Pat. No. 5,243,343 relates to varied time range digitizing as a means of data compression. Memory requirements are minimized by digitizing information after the occurrence of a desired change rate in the data. This invention is not directed to vibration monitoring and has the shortcoming that if the teachings were used in vibration monitoring the method would not form a series of data monitoring records useful in alarm related analysis or regulatory compliance.

U.S. Pat. No. 4,559,828 describes a vibration monitoring system that transmits unprocessed data to a central computer for processing. This invention has the drawback of transmitting large quantities of data to the central computer resulting in an expensive system commercially viable only for critical machinery. The above-described vibration monitoring system is too expensive for many applications.

It is desirable to provide a stand alone monitoring system that can meet the demands of regulatory compliance and can optimally monitor machinery alarm conditions with minimum memory requirements.

SUMMARY OF THE INVENTION

Briefly described, the present invention relates to a method and apparatus for monitoring machinery in which physical data is collected, processed and stored in data records in accordance with a set of application specific retention rules. Each record, R, includes a series of Fourier coefficients $C_{ij}$ at time j containing frequency domain data. A record containing domain data can include coefficients of other than Fourier form. Records, R, can also include a time and date stamp. The physical data can include time varying data such as vibration, temperature or motor current data. The retention rules are based on a comparison of the processed data to an alarm value. As the value of the processed data approaches the alarm value, the resolution precision of the stored data in a record, as well as the frequency with which such records are stored, is increased. In this way, memory management selectively retains more valuable data. Similarly, the process also selectively removes not as valuable data, which process can be defined as decimation.

Memory availability for record storage periodically is compared against a projected memory requirement. If the memory availability is less than the projected memory requirement, certain entire records are deleted under predetermined retention rules in a process defined as secondary decimation.

In the preferred method for monitoring machinery, sensor signals are collected from the machinery. The sensor signals are converted into digital time domain data, which data can be transformed into the frequency domain. The time or frequency domain data is compared against an alarm threshold value. Thereafter, an average spectrum or other data representation (hereinafter defined as "average spectrum") is calculated. The average spectrum is adjusted in accordance with an intra-record retention rule determined by the relationship of the signal to its corresponding alarm value. An alarm can be issued when the data is greater than a predetermined value from the alarm threshold.

Preferably, the average spectrum corresponds to an averaging scheme in which multiple spectra are collected every hour and cumulatively averaged consistent with the retention rule. Hourly spectra averages can be averaged at the end of a shift and the shift averages can be averaged over twenty-four hours for computing a daily average spectrum. At the end of a shift or after the daily average is calculated, the respective hourly or shift spectra are deleted to free memory space.

In the preferred apparatus, a nonvolatile portion of memory, with data intact, can be transferred to a remote computer. Alternatively, an infrared device contained in the apparatus can be used to transfer data to the remote computer. A self-triggering method can also be used for activating the processing of digital data.

The present invention has the advantage of collecting and secondarily decimating entire records comprised of data spectra within certain retention rule constraints. The retention rules reflect application requirements, available memory, projected memory requirements and alarm conditions. Data integrity is central to compliance with governmental regulations, such as those on Process Safety Management issued by OSHA, violations of which in the past 2 years have resulted in fines of more than $5 million. The present invention substantially automates machinery monitoring and record keeping, thereby ensuring record keeping compliance while reducing the cost of compliance with such regulations.

The invention will be more fully described with reference to the following drawings.

BRIEF DESCRIPTION OF THE DRAWINGS

FIG. 6 is a schematic diagram of a display menu which can be used in the monitoring system.

DETAILED DESCRIPTION OF THE PRESENT INVENTION

During the course of this description like numbers will be used to identify like elements according to the different figures which illustrate the invention.

Figure 1A:
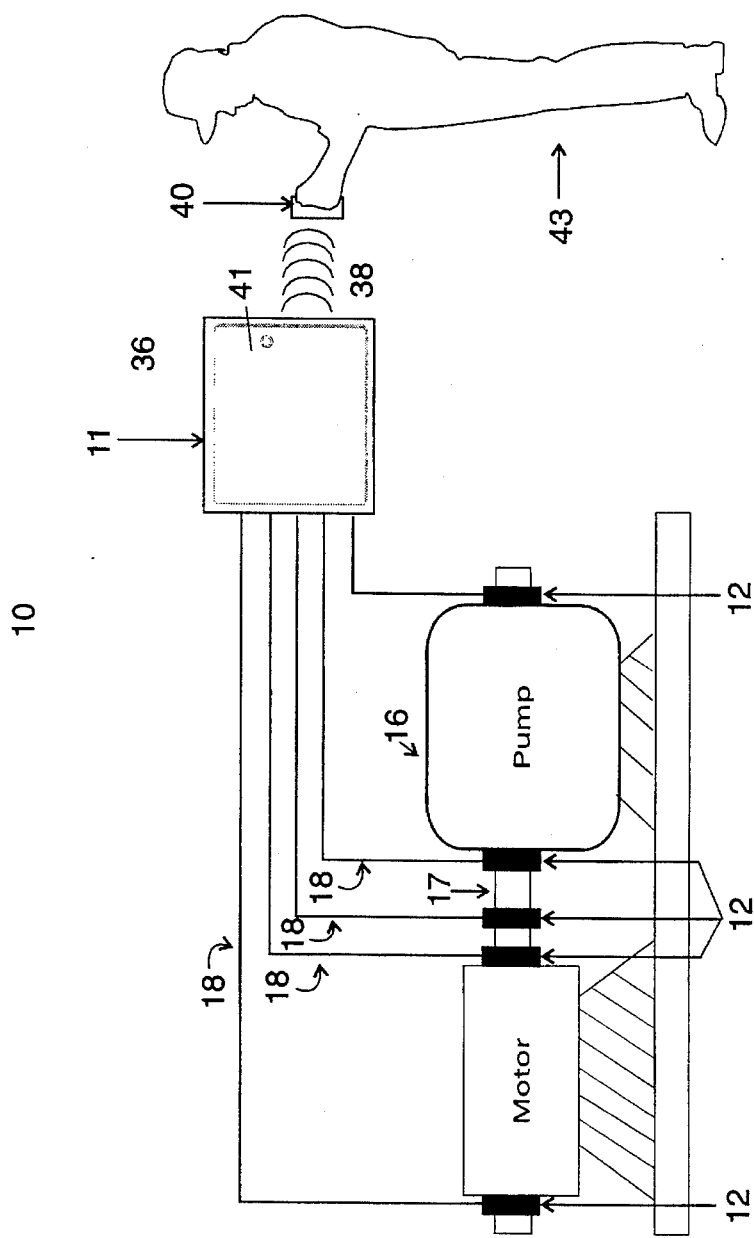
FIG. 1A illustrates a schematic diagram of the present invention in which the monitoring system is connected to a number of machinery sensors.

FIG. 1A illustrates a schematic view of the vibration monitoring system 10 used in a factory setting in accordance with the principles of the present invention. Sensors 12 for measuring operations are mounted to motor 14, pump 16 and coupling 17. Sensor 12 can be used to monitor vibrations of motor 14 and pump 16. Alternatively, sensor 12 can be used to monitor other time varying signals, such as temperature and motor current. It will be appreciated that vibration sensors known in the art can be used in the present invention and can be used to monitor other types of machinery. Signals 18 from sensors 12 are received at collector and processor unit 11.

Collector and processor unit 11 receives, stores and processes signals 18 to create spectra 41, the details of which are described with reference to FIGS. 2–4. Collector and processor unit 11 can provide an alarm 36 when signal 18 has a value that is greater than a predetermined alarm threshold value designated as $A_{to}$. For example, alarm 36 can be a blinking light or horn.

Figure 1B:
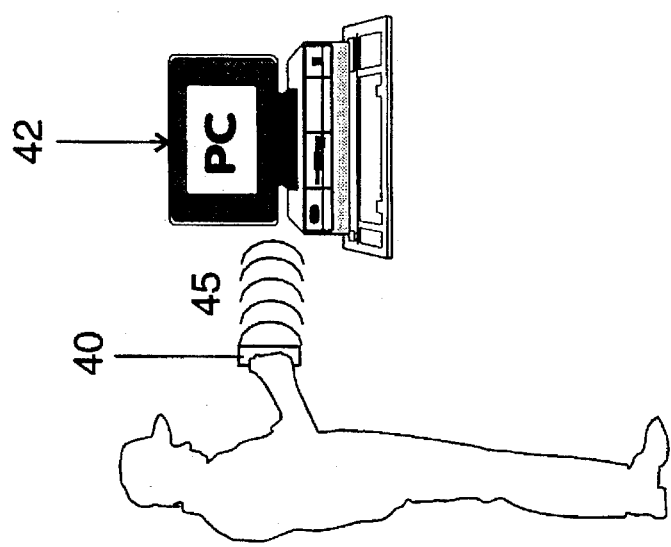
FIG. 1B illustrates a schematic diagram of the monitoring system in which the monitoring system communicates to a central computer.

Data records 41 stored in vibration collector and processor unit 11 can be retrieved remotely by user 43 with an infrared communication 38 to palm top recorder 40. After data record 41 is retrieved, the data record 41 can be stored in palm top recorder 40. Palm top recorders useful for practice of the present invention include those manufactured by Hewlett Packard as Models 100LX and 200LX and similar portable digital devices. Data record 41 can be transferred from palm top recorder 40 to central computer 42 using infrared connection 45, as illustrated in FIG. 1B. For example, central computer 42 can be a personal computer or a workstation.

Figure 2:
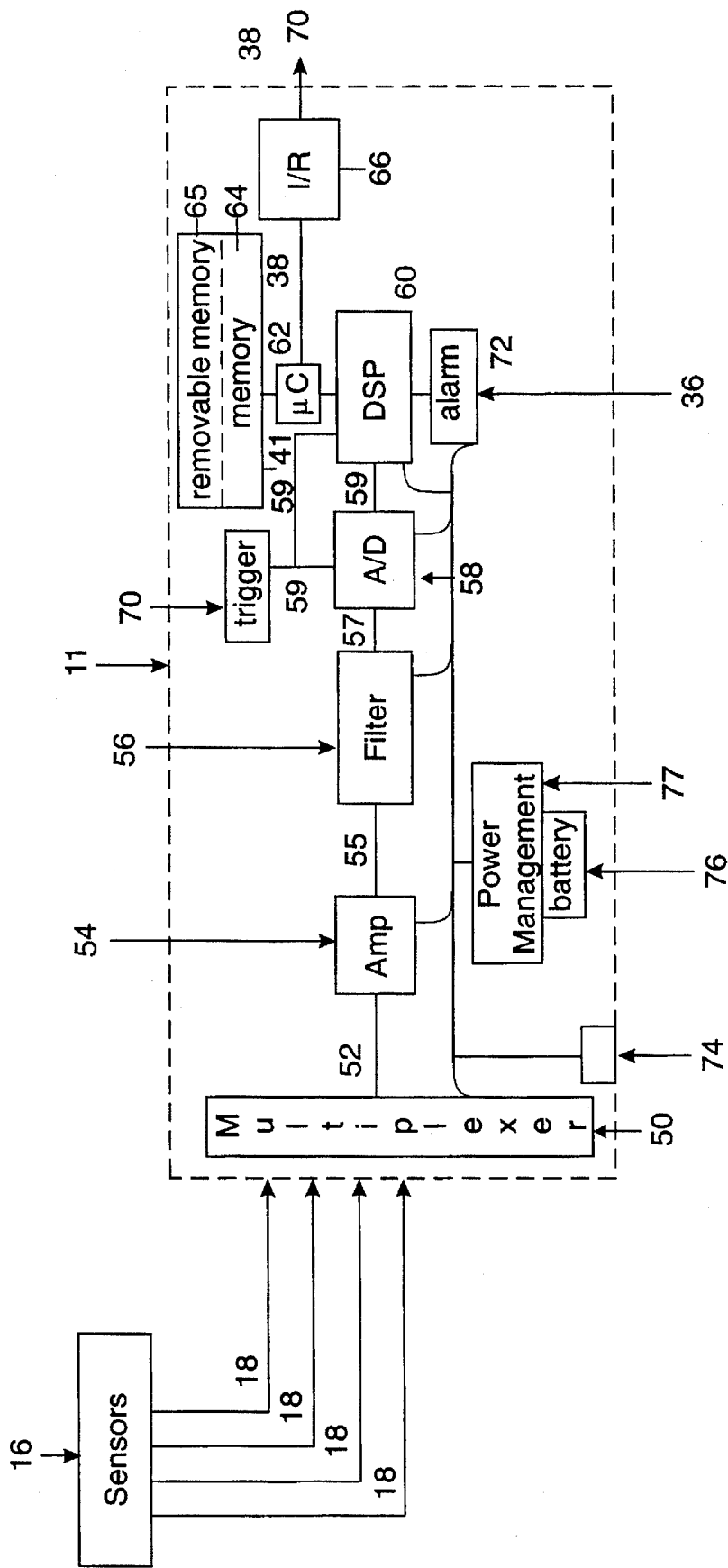
FIG. 2 is a block diagram of the monitoring system of the present invention.

FIG. 2 is a block diagram of the vibration collector and processor unit 11 connected to vibration sensors 12. Signals 18 are received at multiplexer 50. Multiplexer 50 selects among signals 18 from individual sensors 12 which are conveyed as signal 52. Signal 52 is amplified with amplifier 54 to produce amplified signal 55. Amplifier 54 can be a fixed or programmable amplifier for amplifying signal 52 by a predetermined value. Filter 56 receives amplified signal 55. Filter 56 conditions amplified signal 55 to limit the range of frequencies of the signal. For example, filter 56 can limit the range of frequencies of amplified signal 55 to the range of about 0 to about 50 KHz. It will be appreciated that other ranges of filtering frequencies can be used with the teachings of the present invention.

Analog-to-digital converter 58 receives filtered signal 57 for converting filtered signal 57 into digital time domain vibration data which can be represented as digital signals 59. Digital signals 59 are processed with digital signal processor unit 60 to produce data records 41 containing time domain results or spectra in the frequency domain. Digital signal processing unit 60 can perform processing with fast Fourier transforms. For example, a commercially available digital signal processing chip is manufactured by Texas Instruments as TMS320C52.

Data records 41 containing spectra, time domain results and other data can be retained in memory 64. Microcontroller 62 functions as a memory management controller for controlling flow of data records 41. Memory 64 can also store programs, such as for displaying applications and memory management, as well as other information. Preferably, memory 64 is non-volatile. A removable memory portion 65 of memory 64 is nonvolatile and has a standardized detachable connector. An example of a removable memory portion 65 is a PCMCIA device. Removable memory portion 65 can be removed from memory 64 and transferred to palm top recorder 40 or central computer 42.

Infrared module 66 can be used to access data records 41. Preferably, infrared module 66 is wirelessly connected with infrared connection 38 to palm top recorder 40.

Trigger 70 can be coupled to analog-to-digital converter 58 and digital signal processor unit 60. Trigger 70 monitors digital signals 59 to determine if the signal value is greater than a predetermined trigger threshold value, $T_r$. For example, $T_r$ can be in the range of about 0.001G to about 1000G. If digital signal 59 has a value which is greater than the threshold value $T_r$, digital signal 59 is applied to digital signal processor unit 60. If digital signal 59 is less than threshold value $T_r$, digital signal 59 is not applied to digital signal processor unit 60.

Alarm 72 can be linked to digital signal processor unit 60 for producing alarm signal 36. Processor 60 receives data records 41 and compares spectra 41 against an alarm threshold value, $A_{io}$. If the data record 41 has a value greater than alarm threshold value $A_{io}$, alarm 36 will be produced to alert user 43 of an alarm condition.

Collector and processor unit 11 can be powered by external power supply 74. Alternatively, collector and processor unit 11 can be powered with battery 76 or with external power supply 74 in combination with battery 76. A power management circuit 77 can be used with battery 76 for conserving battery power when vibration collector and processor unit 11 is operating without external power supply 74. When powered by battery 76, vibration data collector and processor unit 11 operates on an intermittent schedule stored in memory 64 which controls power management circuit 77 to reduce current drawn to very low levels when digital signal processor 60 is not processing. For example, the current drawn can be reduced to between about 10 mw to about 1 μw. Power management circuit 77 is connected to alarm monitor 72 for issuing an alarm 36 when battery 76 is low.

Collector and processor unit 11 operates as a stand alone device except during data transfer to palm top recorder 40 or central computer 42. During data transfer, monitoring at collector and processor unit 11 can run as a background program which does not appear on display 46 of palm top recorder 40. Palm top recorder 40 can display received data records 41 or can transfer data records 41 to central computer 42. During a communication session, new programs and other data can be loaded into memory 64 via infrared connection 38 or removable memory portion 65.

Data records 41 can be transferred on a predetermined schedule or at another desirable time to central computer 42. An alarm band, which is defined as a series of coefficients describing individual equal amplitudes, the violation of which constitutes an alarm condition can also be included.

Storage of records, R, is constrained by conflicting demands of minimum memory 64 to reduce costs and the need to retain data for regulatory compliance and for post alarm analysis of developing conditions, which concepts will be further described with reference to FIGS. 3 and 4. During a data transfer session, the operator can transfer one or more data records 41, R, such as those records related to signals 18 that produce an alarm 36. In the vibration monitoring system 10, the data retention rules decrease the maximum allowable interval between related records as signal 18 approaches an alarm threshold, $A_{io}$.

Figure 3:
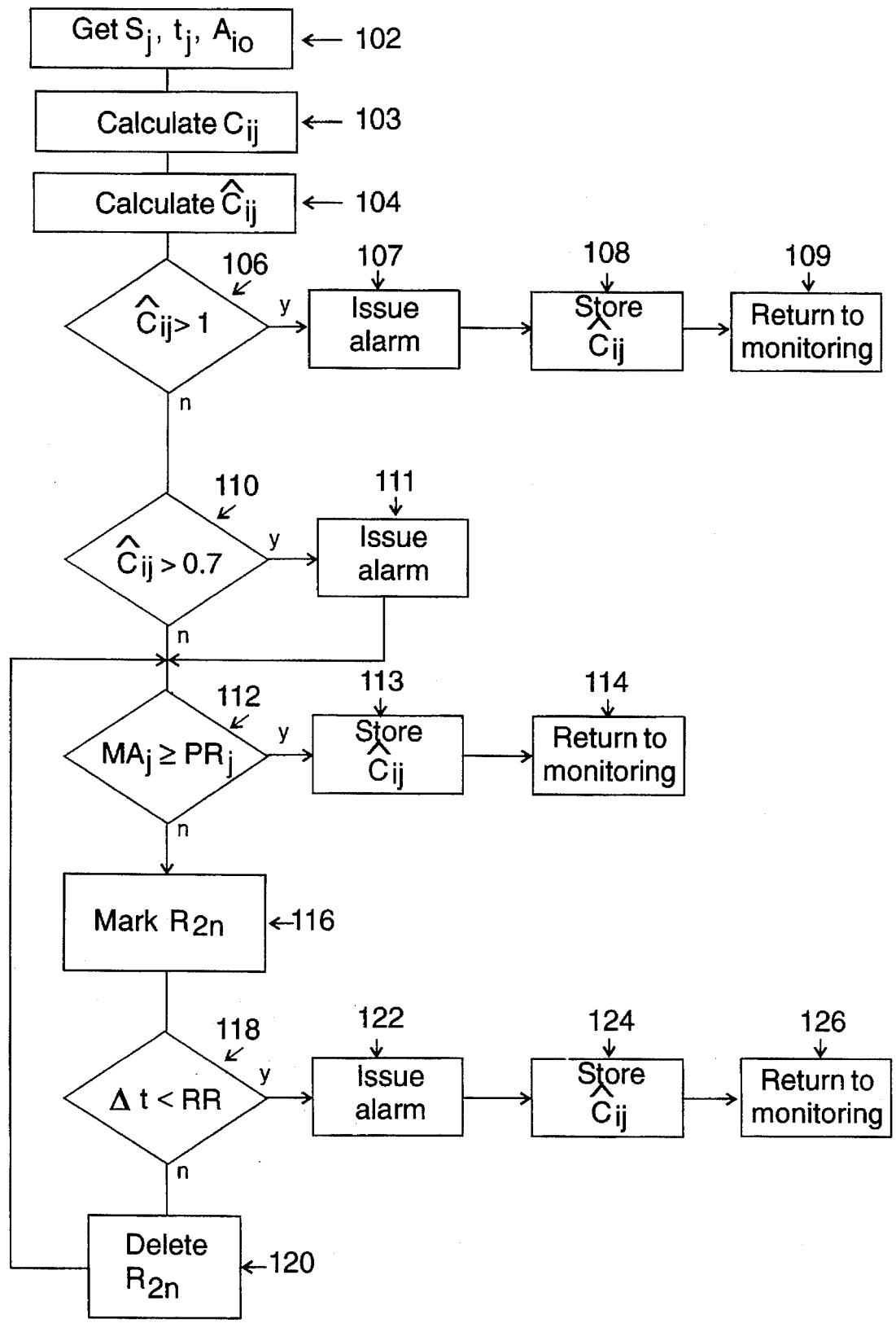
FIG. 3 is a flow diagram of a data management method of the present invention used in the monitoring system shown in FIG. 2.

FIG. 3 illustrates a flow diagram of a memory management module 100 used in collector and processor unit 11 for storing data records 41. Digital signal 59, shown in FIG. 2, is represented as $S_j$, the current time is represented as $t_i$ and the alarm threshold is represented as $A_{io}$. Fourier coefficients $C_{ij}$ for signal $S_j$ at time $t_i$ are calculated in block 103, which calculation is performed in digital signal processor 60. Normalized Fourier coefficients, $\hat{C}_{ij}$ are calculated in block 104 and can be in linear or log units of measure (hereinafter collectively referred to as "normalized Fourier coefficients $\hat{C}_{ij}$"). The normalized Fourier coefficients, $\hat{C}_{ij}$ are calculated from the equation $C_{ij}/A_{io}$ or $\log C_{ij}/\log A_{io}$. Normalized Fourier coefficients, $\hat{C}_{ij}$ are checked in block 106 and if greater than one are judged to have created an alarm condition.

If one or more normalized Fourier coefficient, $\hat{C}_{ij}$, is greater than 100%, an alarm 36 is issued, as shown in block 107. After issuing alarm 36, normalized Fourier coefficients, $\hat{C}_{ij}$, are stored in memory 64 in block 108. After the normalized Fourier coefficients, $\hat{C}_{ij}$, are stored, block 109 returns to block 102 to continue monitoring. In block 110, normalized Fourier coefficients, $\hat{C}_{ij}$, are checked. If normalized Fourier coefficients, $\hat{C}_{ij}$, are greater than 70%, an alarm 36 is issued in block 111 unless an alarm has already been issued in block 107. If no alarm 36 has issued in block 111, or after block 110 is executed, block 112 is executed to compare the memory availability, $MA_j$, for memory 64 to projected memory requirements, $PR_j$. $PR_j$ represents the anticipated memory requirements at times prior to the next scheduled data transfer.

Data records 41, R, can be decimated following data retention rules, RR, for providing additional memory availability, $MA_j$. If memory availability, $MA_j$, is greater than or equal to the projected memory requirements, $PR_j$, the normalized Fourier coefficients, $\hat{C}_{ij}$, are stored in block 113 and block 114 is executed to return to monitoring. Alternatively, if memory availability, $MA_j$, is less than the projected memory, $PR_j$, previously stored records are secondarily decimated to free memory. Secondary decimation is defined as the removal or erasure of a fraction of the previously stored records, which fraction may be between $1/128$ and $127/128$.

As an example of secondary decimation, ½ of all records are removed in this embodiment. In block 116, all even records $R_{2n}$ are marked. A maximum time interval between adjacent records is designated at $\Delta t$. After block 116, the time interval $t_{2n}$ between records adjacent to $R_{2n}$, defined as $R_{2N-1}$ and $R_{2N+1}$, are compared against maximum permitted time intervals, $\Delta t$, in retention rules, RR, in block 118. If $t_{2n} > \Delta t$, then even record $R_{2N}$ is deleted in block 120. Checking and deletion is repeated for all $R_{2n}$, after which module 100 returns to block 112 to repeat block 112 for checking if the memory availability, $MA_j$, is greater than the projected memory, $PR_j$. If $PR_j > MA_j$, marking and secondary decimation is repeated until $PR_j < MA_j$ or no more records can be removed. If no more records can be removed and the projected memory, $PR_j$ is still greater than the memory availability $MA_j$, then an alarm is issued. After the storage of normalized Fourier coefficients, $\hat{C}_{ij}$, in block 124, memory management module 100 returns to monitoring in block 126.

Figure 4:
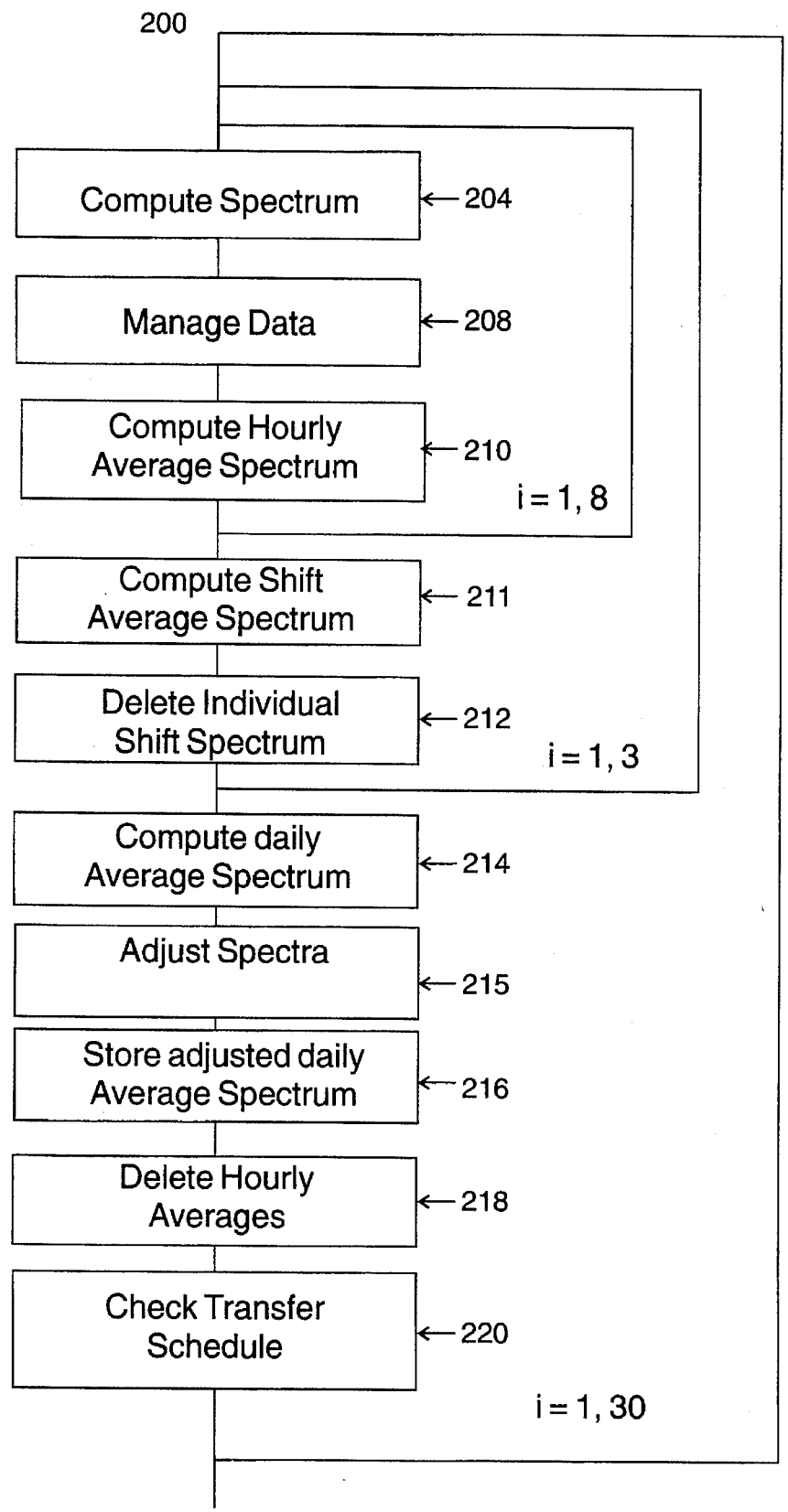
FIG. 4 is a flow diagram of a method for spectrum averaging of the present invention.

FIG. 4 illustrates the spectrum averaging module 200 for spectrum averaging for a sensor 12 is accomplished in block 204 by averaging $C_{ij}$ over the individual spectra used to compute the averaged spectrum comprised of average Fourier coefficients $C_{ij,av}$. An hourly averaged spectrum is produced in block 210 (FIG. 4) by averaging the individual spectra for a sensor 12 processed during a one-hour period, being defined as an hourly average spectrum. Other overages for other periods may be produced by similar procedures. Data management module 208 stores the averaged spectrum according to a set of retention rules, RR. The retention rules, RR, are application specific. A preferable set of retention rules, RR, are illustrated in Table 1.

TABLE 1

| Condition | Retention Rule |
| --- | --- |
| 1) $\Delta t \geq 1.0$ hrs For day/current 24 hour | |
| 2) If $\hat{C}_{ij} \leq 0.4$ | $\Delta t \leq 7$ days Resolution = 400 lines Precision = 5 bits |
| 3) If $0.4 < \hat{C}_{ij} \leq 0.6$ | 7 days $\geq \Delta t \geq t_{.1} = 10\% A_{io}$ Resolution = 800 lines Resolution = 6 bits |
| 4) If $0.6 < \hat{C}_{ij} \leq 0.8$ | 7 days $\geq \Delta t \geq t_{.05} = 5\% A_{io}$ Resolution = 1600 lines Precision = 7 bits |
| 5) If $0.8 < \hat{C}_{ij}$ | 7 days $\geq \Delta t \geq t_{.025} = 2.5\% A_{io}$ Resolution = 3200 lines Precision = 8 bits |

Compression of data records, R, at time of storage can be performed by a reduction of spectral resolution, i.e, the number of normalized Fourier coefficients, $\hat{C}_{ij}$, of the spectrum and by reduction of the precision of the coefficients $C_{ij,av}$, at the time of storage of the daily average spectrum within the constraints of the retention rules, RR. Reduction of resolution can be accomplished by averaging pairs of adjacent coefficients in one or more iterations. Reduction of precision can also be accomplished by truncation of the bit-length of coefficients. It will be appreciated that other schemes for reduction of coefficients can be used. In all instances of coefficient removal, certain normalized coefficients $\hat{C}_{ij}$, that are of particular diagnostic interest can be retained. Both resolution and precision can be reduced more when signal 18 value is low relative to the alarm threshold, $A_{io}$ then when signal 18 is relatively high. As described in retention condition 1 of Table 1, the retention rules, RR, have the first condition that the minimum time interval, $\Delta t$, for storing a spectrum in memory 64 is one hour.

An hourly spectrum is calculated in block 210 of FIG. 4. In a preferred embodiment an hourly average spectrum is calculated each hour for eight hours, the length of a shift. A shift averaged spectrum is computed by averaging the hourly averages in block 211. After the shift average spectrum is calculated, the hourly average spectra are deleted in block 212.

Block 214 computes a daily average spectrum by averaging the three shift average spectra calculated in block 211 and deleting the corresponding shift averages. Block 215 compares the normalized Fourier coefficients, $\hat{C}_{ij}$, to the ranges specified in the retention rules, RR, and adjusts the resolution and precision of the coefficients $\hat{C}_{ij}$ stored as the daily average spectrum. Certain $\hat{C}_{ij}$ which are of diagnostic values shall be retained.

As an example of the operation of retention rules, RR, when the daily average spectra normalized Fourier coefficients, $\hat{C}_{ij}$, satisfy retention rule, RR, condition 5 of having at least one value of a normalized Fourier coefficient, $\hat{C}_{ij}$, greater than 80% the alarm threshold, $A_{io}$, up to the alarm threshold, $A_{io}$, the daily average spectra normalized Fourier coefficients, $\hat{C}_{ij}$, retain a resolution of 3200 lines and a precision of 8 bits. The minimal time interval $\Delta t$ is adjusted to the period during which in the daily average spectrum the coefficients have risen at least 2.5% of the value of the alarm threshold $A_{io}$ or 7 days, which ever is less. It will be appreciated that other application specific retention rules could be provided within the scope of the teachings of the present invention.

The retention rule conditions provide that the density of the data stored in memory 64 is increased as the alarm thresholds $A_{io}$ are reached. After the adjusted daily average spectra is stored in block 216, the hourly average spectra are deleted in block 218 for reducing requirements of memory 64.

In block 220, a transfer schedule is checked to determine if the stored records should have been transferred to central computer 42 on the current or prior data which transfer has not been effected. If a scheduled data transfer has not occurred, an alarm 36 is issued.

Figure 5:
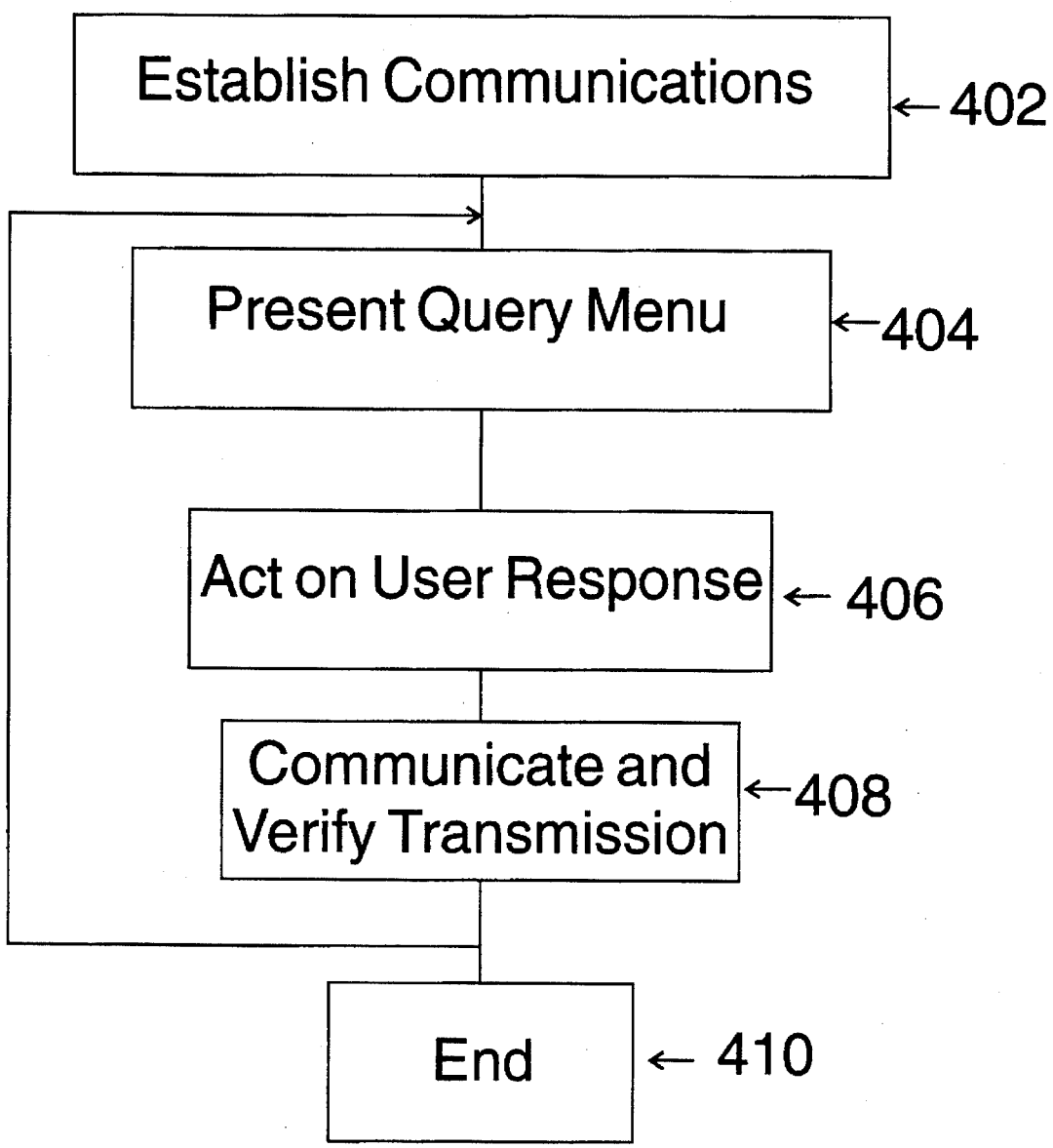
FIG. 5 is a flow diagram of a method for establishing communications between the monitoring system and an external device.

For data transfer, communications are established between user 43 and vibration data collector and processor unit 11, as shown in FIG. 5. A user enters a command on a palm top recorder 40 for establishing communications in block 402 to vibration collector and processor unit 11. Preferably, the command can be entered from a menu displayed on palm top recorder 40. After communication has been established, a query menu 80 is displayed on palm top recorder 40 for further actions of user 43 in block 404. As shown in FIG. 6, query menu 80 can include the options of retrieving the sensor status, alarm status, alarm trend, alarm spectrum, memory status or main menu. After user 43 selects an option, microprocessor 62 acts on the user option in block 406 and transfers requested data. Palm top computer 40 then sends a message verifying the transmission to user 43 in block 408. User 43 can issue further commands by returning to block 402. Alternatively, user 43 can end the communication session in block 410.

Figure 7:
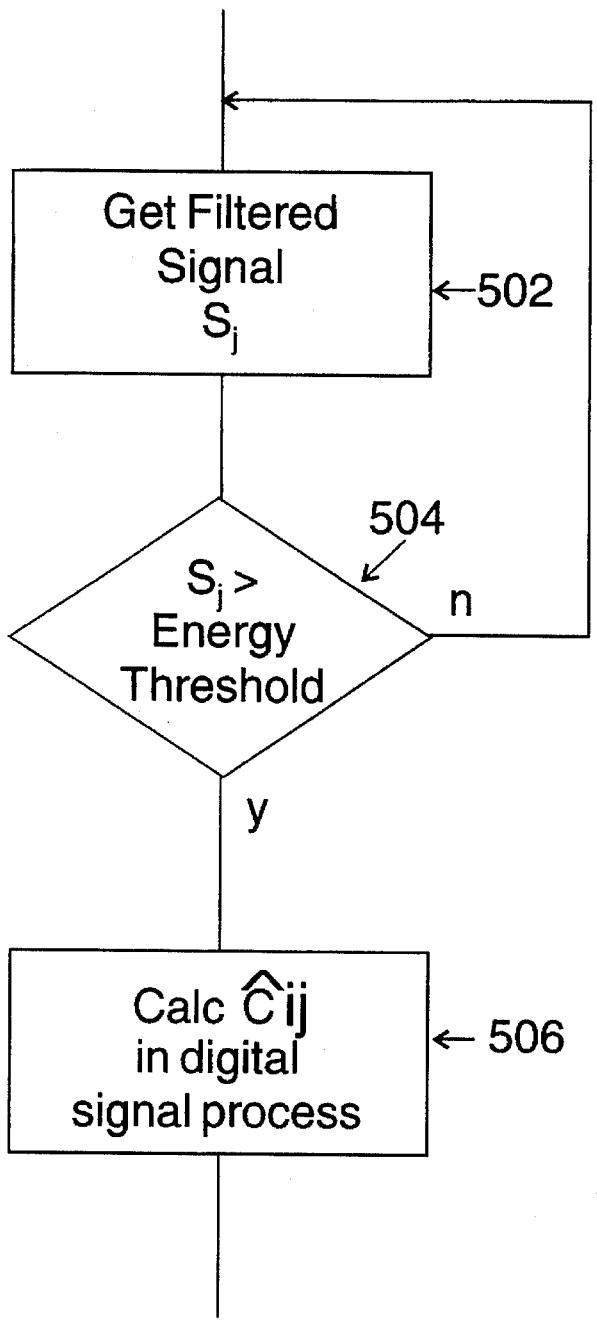
FIG. 7 is a flow diagram of a method for self-triggering the monitoring system of the present invention.

FIG. 7 illustrates self-triggering module 500 for self-triggering collector and processor unit 11. Block 502 receives signal, $S_j$. Block 504 compares signal, $S_j$, to an energy threshold value, $T_r$. If signal, $S_j$ does not meet the condition of being greater than trigger energy threshold, $T_r$, module 500 returns to block 502 to receive the next signal, $S_j$. When signal, $S_j$, is greater than energy threshold, $T_r$, normalized Fourier coefficients, $\hat{C}_{ij}$, are calculated in block 506 in digital signal processor 60.

The present invention has the advantage of minimizing the cost of memory while retaining monitoring data in a manner enabling compliance with Federal Regulations. The invention also provides increased spectrum precision and temporal density of records as the vibration in the collected data approaches an alarm threshold. Memory availability is monitored against projected requirements to enable erasure of unneeded stored records, thereby extending the productivity of the apparatus. Data transfer is expeditiously accomplished with an infrared link or removable memory portion. The present invention provides an efficient monitoring apparatus for compliance with Federal regulations and vibration analysis related to alarms at lost cost.

While the invention has been described with reference to the preferred embodiment, this description is not intended to be limiting. It will be appreciated by those of ordinary skill in the art that modifications may be made without departing from the spirit and scope of the invention.

I claim:

1. A method for monitoring machinery comprising the steps of:
   a. collecting sensor signals from said machinery, said sensor signals each having a time stamp;
   b. converting said sensor signals into digital time domain data;
   c. transforming said digital time domain data into frequency domain data, which both together comprise processed data;
   d. comparing said processed data against alarm threshold values to determine an alarm condition;

e. forming data records of said processed data and said time stamps;

f. comparing said processed data to data retention rules which increase the density of data storable as said sensor signals approach said alarm threshold;

g. storing said data records in memory storage means; and h. selectively removing certain of said stored data records in order to permit greater spacing between data records of lower level signals than that of higher level signals.

2. The method of claim 1 further comprising the step of communicating said stored data record to a remote computer.

3. The method of claim 2 wherein said processed data is compared to said alarm threshold for storage in said memory means according to said retention rule.

4. The method of claim 3 wherein said processed data comprise a spectrum.

5. The method of claim 4 wherein a plurality of said spectrum formed in an hour time period are averaged together to provide an hourly averaged spectrum.

6. The method of claim 5 further comprising the step of:

computing an average daily spectrum from said stored hourly average spectra.

7. The method of claim 6 further comprising the steps of:

storing said average daily spectrum in said storage means; and deleting said stored hourly averaged spectra from said storage means.

8. The method of claim 7 further comprising the step of:

comparing said time domain data to a trigger threshold before said step of transforming said digital time domain data and (i) if said time domain data is less than said trigger threshold repeating said step (a) of collecting sensor signals, or (ii) if said time domain vibration data is greater than said trigger threshold performing said transforming step.

9. The method of claim 8 further comprising the steps of:

communicating to a remote computer; and transferring said stored daily average spectrum to said remote computer.

10. The method of claim 9 further comprising the step of:

issuing an alarm when the value of said processed data is greater than said alarm threshold value.

11. The method of claim 10 further comprising the steps of:

comparing the memory availability, $MA_j$, of said storage means against a projected memory requirement $PR_j$ and if said memory availability $MA_j$ is less than said projected memory $PR_j$ deleting certain said stored data records.

12. The method of claim 11 wherein said communicating step is performed with an infrared connection.

13. The method of claim 12 wherein said storage means has a non-volatile removable portion and said transferring step is performed by removing said nonvolatile removable portion from said storage means.

14. The method of claim 1 wherein said sensor signals represent vibration data.

15. A method for managing memory in a monitoring system comprising the steps of:

determining a series of data records containing said processed data;

determining a daily average of said data records;

storing said daily average of said data records in accordance with a predetermined time interval determined by a set of retention rules, wherein said retention rules which increase the density of data storable as said data records approach an alarm value are based on a comparison of the value of said series of data records to said alarm value.

16. The method of claim 15 wherein said retention rules direct reduction of the resolution and precision of said spectrum in said stored daily average when said value of said series of data records is low relative to said alarm value.

17. The method of claim 16 wherein said time interval between said stored records has a maximum value.

18. The method of claim 17 further comprising the step of:

issuing an alarm when said processed data to said alarm threshold is greater than a predetermined value.

19. An apparatus for monitoring machinery comprising:

sensor means attached to said machinery for providing sensor signals;

means for converting said sensor signals into digital time domain data;

digital processing means for converting said time domain data into processed data;

means for comparing said processed data to an alarm threshold to determine an alarm condition;

means for creating a data record of said processed data;

means for adjusting said data record in accordance with a set of retention criteria corresponding to said alarm band;

means for comparing the memory availability, $MA_j$, of said storage means against a projected memory requirement $PR_j$ and deleting certain of said stored data records; and means for issuing an alarm when said memory availability is less than said projected memory requirement, $PR_j$.

20. The apparatus of claim 19 further comprising:

trigger means for comparing said time domain data to a trigger threshold value, and if said time domain data is greater than said trigger threshold value activating said digital processing means.

21. The apparatus of claim 20 further comprising:

means for remotely transferring said stored average spectrum to a central computer.

22. The apparatus of claim 21 wherein said means for remotely transferring said stored average spectrum comprises:

an infrared device for wireless communications between said central computer and said storage means.

23. The apparatus of claim 21 when said means for remotely transferring said stored average spectrum comprises:

a nonvolatile portion of said storage means, said nonvolatile portion being removable from said storage means and transferrable to said central computer.

24. The apparatus of claim 21 further comprising battery means for supplying power to said apparatus; and battery management control means for controlling utilization of said power.

* * * * *